(12) United States Patent
Han et al.

(10) Patent No.: US 6,638,875 B2
(45) Date of Patent: Oct. 28, 2003

(54) OXYGEN FREE PLASMA STRIPPING PROCESS

(75) Inventors: Qingyan Han, Columbia, MD (US); Ivan Berry, Ellicot City, MD (US); Palani Sakthivel, Gaithersburg, MD (US); Ricky Ruffin, Gaithersburg, MD (US); Mahmoud Dahimene, Sunnyvale, CA (US)

(73) Assignee: Axcelis Technologies, Inc., Beverly, MA (US)

( * ) Notice: Subject to any disclaimer, the term of this patent is extended or adjusted under 35 U.S.C. 154(b) by 0 days.

(21) Appl. No.: 09/876,318

(22) Filed: Jun. 7, 2001

(65) Prior Publication Data

US 2001/0027016 A1 Oct. 4, 2001

Related U.S. Application Data

(62) Division of application No. 09/368,553, filed on Aug. 5, 1999, now Pat. No. 6,281,135.

(51) Int. Cl.$^7$ .............................................. H01L 21/302
(52) U.S. Cl. ...................................... 438/725; 438/963
(58) Field of Search ................................. 438/706, 714, 438/710, 712, 725, 963

(56) References Cited

U.S. PATENT DOCUMENTS

| | | | |
|---|---|---|---|
| 4,201,579 A | 5/1980 | Robinson et al. | 430/323 |
| 4,341,592 A | 7/1982 | Shortes et al. | 156/643 |
| 4,491,499 A | 1/1985 | Jerde et al. | 156/626 |
| 4,695,700 A | 9/1987 | Provence et al. | 219/121 |
| 4,980,022 A | * 12/1990 | Fujimura et al. | 438/704 |
| 5,498,308 A | 3/1996 | Kamarehi et al. | 156/345 |
| 5,694,207 A | 12/1997 | Hung et al. | 356/72 |
| 5,728,253 A | 3/1998 | Saito et al. | 156/345 |
| 5,739,051 A | 4/1998 | Saito | 438/16 |
| 5,770,523 A | 6/1998 | Hung et al. | 438/724 |
| 5,773,201 A | 6/1998 | Fujimara et al. | 430/329 |
| 5,807,761 A | 9/1998 | Coronel et al. | 438/14 |
| 5,824,604 A | 10/1998 | Bar-Gadda | 438/725 |
| 5,846,373 A | 12/1998 | Pirkle et al. | 156/345 |
| 5,877,032 A | 3/1999 | Guinn et al. | 438/9 |
| 5,877,407 A | 3/1999 | Cadet et al. | 73/24.01 |
| 5,882,489 A | 3/1999 | Bersin et al. | 204/192.35 |

(List continued on next page.)

FOREIGN PATENT DOCUMENTS

| | | |
|---|---|---|
| WO | WO/99/26277 | 10/1997 |
| WO | WO/97/37055 | 5/1999 |

OTHER PUBLICATIONS

Michael A. Lieberman and Allan J. Lichtenberg, *Principles of Plasma Discharges and Material Processing*, p. 4 (1994) John Wiley & Sons, Inc.

(List continued on next page.)

*Primary Examiner*—Kin-Chan Chen
(74) *Attorney, Agent, or Firm*—Watts Hoffmann Co., L.P.A.

(57) ABSTRACT

A method for stripping photoresist and/or removing post etch residues from an exposed low k dielectric layer of a semiconductor wafer in the presence or absence of copper. The method comprises creating an oxygen free plasma by subjecting an oxygen free gas to an energy source to generate the plasma having electrically neutral and charged particles. The charged particles are then selectively removed from the plasma. The electrically neutral particles react with the photoresist and/or post etch residues to form volatile gases which are then removed from the wafer by a gas stream. The oxygen free, plasma gas composition for stripping photoresist and/or post etch residues comprises a hydrogen bearing gas and a fluorine bearing wherein the fluorine bearing gas is less than about 10 percent by volume of the total gas composition.

6 Claims, 7 Drawing Sheets

U.S. PATENT DOCUMENTS

| | | | |
|---|---|---|---|
| 5,908,319 A | | 6/1999 | Xu et al. .................... 438/725 |
| 5,935,868 A | | 8/1999 | Fang et al. ................ 438/692 |
| 5,950,106 A | | 9/1999 | May et al. .................. 478/669 |
| 5,965,934 A | * | 10/1999 | Cheung et al. ............. 257/642 |
| 6,030,901 A | * | 2/2000 | Hopper et al. .............. 438/711 |
| 6,037,255 A | * | 3/2000 | Hussein et al. ............. 438/675 |
| 6,080,529 A | | 6/2000 | Ye et al. .................... 430/318 |
| 6,096,232 A | | 8/2000 | Hashimoto .................. 216/60 |
| 6,235,453 B1 | * | 5/2001 | You et al. .................. 430/329 |

OTHER PUBLICATIONS

Brian Chapman, *Glow Discharge Processes*, pp. 305, 316–317 (1980) John Wiley & Sons, Inc.

Wayne M. Moreau, *Semiconductor Lithography Principles, Practices, and Materials*, pp. 806, 807 (Jan. 1988) 1988 Plenum Press, New York, NY.

Q. Han, M. Dahimene, P. Sakthivel, R. Mohondro, I. Berry, *Achieving Highly Selective Resist Strip and Residue Removal Over Dielectric Low–k*, Future Fab International, vol. 7, pp. 219–222 (1999).

* cited by examiner

OXYGEN FREE PLASMA STRIPPING PROCESS

This is a Divisional application of application Ser. No. 09/368,553, filed on Aug. 5, 1999 now U.S. Pat. No. 6,281,135 B1.

FIELD OF INVENTION

This invention relates generally to a plasma stripping process. More particularly, this invention relates to an oxygen free plasma process for removing photoresist and/or etch residues from low k dielectric surfaces or in the presence of low k dielectric materials during integrated circuit manufacturing. The gas for generating the oxygen free plasma comprises a mixture of a hydrogen bearing gas and a fluorine bearing gas.

BACKGROUND OF THE INVENTION

Integrated circuits are now transitioning from aluminum to copper metal interconnects as device generation goes beyond the 0.35 $\mu$m design rules. Aluminum metal is limited for these design rules due to its inability to reliably carry current in smaller sized circuit lines. Copper has lower resistivity than aluminum so it can carry more current in a smaller area, thus enabling faster and denser chips with increased computing power. Moreover, the use of copper simplifies interconnect routing. This reduces the number of interconnect levels required and consequently removes numerous process steps which directly impact the device yield. Beyond the 0.25 $\mu$m generation, current densities can reach levels that induce electromigration failure of traditional doped-aluminum conductors. The increased electromigration resistance of copper relative to aluminum overcomes this limitation, which primarily impacts the finest pitch lines found at the lower interconnect levels. Thus, copper is becoming the preferred conductor for integrated circuits.

Along with the transition from aluminum to copper is the improvement upon the dielectric insulating layers. Silicon dioxide has been traditionally used as the primary material used for insulators and has a dielectric constant of about 3.9. New insulating materials for interconnects such as low k dielectrics have been proposed, which lower interconnect capacitance and crosstalk noise to enhance circuit performance. These low k dielectrics typically comprise organic polymers and have dielectric constants less than about 3.5. Some examples of low k dielectrics include polyimide, fluorocarbons, parylene, hydrogen silsesquioxanes, benzocyclobutenes or the like.

Fabrication of integrated circuits using copper interconnects and low k dielectrics present new challenges and problems for the semiconductor manufacturer. In order to make these devices, the manufacturers commonly use a damascene process. The damascene process uses most of the same chipmaking technologies to form the interconnect as the traditional structure but differs in the way the structure is built. Instead of etching a pattern in a metal film and surrounding it with dielectric material, a damascene process etches a pattern into a dielectric film, then fills the pattern with copper. An advantage to damascene processing is that the metal etch is replaced by a simpler dielectric etch as the critical step that defines the width and spacing of the interconnect lines. One of the problems manufacturers must overcome occurs after the pattern is etched into the low k dielectric layer. The photoresist used to define the metal circuit pattern into the low k dielectric layer and any post etch residues including sidewall polymer deposition need to be throughly removed or stripped from the underlying layer. The existing stripping processes are not adequate for removing photoresist and post etch residues from low k dielectric surfaces.

There are two generally recognized stripping processes for removing photoresist and post etch residues remaining on the surface after the dielectrics etch is complete. The residual photoresist and post etch residues can be removed by using either a wet or a dry chemistry. Wet chemistry involves removing photoresist and post etch residues by dissolution in a suitable organic solvent. However, the cost of wet chemistry, environmental concerns with its use and contamination issues have led most manufacturers to use a dry process. One such dry process is commonly referred to as ashing.

Ashing is a technique or process by which the residual photoresist and post etch residues are exposed to a plasma. Typically, the plasma is generated from a gas mixture containing oxygen gas as one of its components. The highly reactive oxygen plasma reacts with or oxidizes the organic photoresist layer. The oxidation or combustion products resulting from the ashing operation are volatile components such as carbon dioxide and water vapor, and are carried away in a gas stream. Ashing is preferred to wet chemical removal because fewer process steps are involved, less handling of the substrates is required, chemicals and chemical handling equipment are reduced, and ashing is more environmentally acceptable.

One problem with oxygen containing plasmas is that they are generally unsuitable for use with copper and most low k interconnects. The etch selectivity of the oxygen containing plasma with low k dielectric materials is generally poor, especially for those low k dielectrics that are organic. The materials used for the photoresists are similar to those used for the low k dielectric materials. That is, both materials are easily oxidized by an oxygen containing plasma to form volatile by-products. As a result, the low k materials are removed at roughly the same rate as photoresist by an oxygen plasma, making the ash selectivity of photoresist to low k materials close to unity. Even using very dilute oxygen mixtures, which at the same time significantly slows the ashing reaction, has not overcome this problem. The challenge is to remove photoresist and post etch residues subsequent to lithography and etch processes without affecting the pattern etched into the low k dielectric layer. Small deviations in the etched profiles can adversely impact device performance, yield and reliability of the final integrated circuit.

Copper is a readily oxidizable, ductile material and as such, is prone to oxidation with the use of oxygen containing plasmas. The build-up of copper oxide from exposure to oxygen containing plasmas is detrimental to device performance. Higher contact resistance results which impedes the flow of current through the integrated circuit. Consequently, clock speed and electromigration can be affected.

Another problem with the use of the oxygen plasma on low k dielectric layers is that the oxygen plasma has been found to change the dielectric constant during ashing. For example, it has been found that doped oxide low k materials, such as nanoglasses and aerogels, exposed to the oxygen containing plasma result in an increase in the dielectric constant. An increase in dielectric constant undesirably affects interconnect capacitance and cross talk. It is believed that this is due to the oxidation of the Si—H and Si—OH bonds to form Si—O bonds. Still further, the use of an oxygen plasma with integrated circuits having copper as the interconnect tends to oxidize the exposed copper surface and deleteriously affect device performance.

U.S. Pat. No. 4,201,579 discloses a method for removing photoresist from a substrate by a hydrogen plasma. The hydrogen plasma removes photoresist from an easily oxidizable metal surface such as gold, silver, copper and the like. The patented process is comparatively slow, not amenable to high throughput processing and not effective for removing most residues from the semiconductor wafer.

Accordingly, it is an object of this invention to provide a high throughput dry ashing process with high selectivity for removing photoresist and post etch residues from integrated devices having copper interconnects and low k dielectric insulating layers. It is a further object of this invention to provide a process that is nonoxidative such that any exposed copper interconnects are not oxidized during the ashing process. Moreover, it is another aspect of this invention that the novel ashing processes remove any native oxide that may have formed on the exposed copper interconnects, thus improving device performance.

SUMMARY OF THE INVENTION

In general, the present invention is directed to a method for stripping photoresist and/or post etch residues from a substrate. The photoresist and post etch residues are removed from the substrate by exposure to an oxygen free plasma. The oxygen free plasma is generated by exposing a plasma gas composition to a microwave source. A preferred plasma gas composition comprises a mixture of a hydrogen bearing gas and a fluorine bearing gas.

The inventive method includes placing at least one substrate having photoresist and/or post etch residues thereon into a plasma reaction chamber. A reactive species is formed by generating a plasma in the absence of oxygen wherein a gas for generating the plasma comprises a hydrogen bearing gas and a fluorine bearing gas. The reactive species generated by the mixture removes the photoresist by reacting to form volatile products. The post etch residues are removed by volatilization in the reaction chamber or by weakening adhesion to the substrate or by becoming water soluble. The residues not volatilized are subsequently removed in a deionized water rinse step. The stripping process continues until the volatile reaction products from the reaction between the photoresist and/or post etch residues are no longer evolved or the photoresist and/or etch residues are rendered water removable.

The fluorine bearing gas includes those compounds that generate a fluorine reactive species when excited by the plasma. Preferably, the fluorine bearing gas is selected from the group consisting of $C_xH_yF_z$ wherein x ranges from 1 to 4, y ranges from 0 to 9 and z ranges from 1 to 10, $NF_3$, $F_2$, and $SF_6$. More preferably, the fluorine compound is $CF_4$ or $CHF_3$.

The hydrogen bearing gas is selected from the group consisting of a hydrocarbon, hydrofluorocarbons, hydrogen gas or a hydrogen gas mixture. The hydrocarbon may be unsubstituted or may be partially substituted with a halogen such as bromine, chlorine or fluorine, or with oxygen, nitrogen, hydroxyl and amine groups. Preferably, the hydrocarbon has at least one hydrogen and has from one to twelve carbon atoms. Examples of suitable hydrogen bearing gases include methane, ethane, and propane. The hydrogen gas mixture is preferably a mixture of hydrogen gas and an inert gas such as nitrogen, argon, helium, and neon. Preferably, the hydrogen gas mixture is a so-called forming gas which comprises a mixture of the hydrogen gas with the nitrogen gas. For a non-load locked plasma chamber configuration, the hydrogen gas ranges in an amount from about 3 percent to about 5 percent by volume of the forming gas for safety considerations.

In a particularly preferred embodiment, the plasma gas comprises a mixture of a forming gas and a carbon tetrafluoride gas. The preferred forming gas comprises a mixture of a hydrogen gas and a nitrogen gas wherein the hydrogen gas ranges in an amount from about 3 percent to about 5 percent by volume of the forming gas. The carbon tetrafluoride gas is less than about 10 percent by volume of the total plasma gas. The substrates to be stripped by the plasma are preferably heated from about 80° C. to about 350° C. to accelerate the reaction time and maximize throughput. For organic low k materials the wafers are preferably heated from about 80° C. to about 180° C. The plasma produces fluorine and hydrogen reactive species that are electrically neutral and charged particles thereof. The charged particles are selectively removed prior to reaching the reaction chamber. The neutral species of the plasma reacts with the photoresist and the post etch residues to produce volatile alkanes. More preferably, the neutral species reacts with the photoresist and the post etch residues to produce methane gas as the principal reaction product. Preferably the etching selectivity of the plasma between the photoresist and/or post etch residues, and a substrate is at least greater than about 10 to 1.

In a preferred embodiment the photoresist and/or post etch residues are removed from a low k dielectric layer. A dielectric constant of the low k dielectric layer advantageously remains constant before and after removing the photoresist and the post etch residues.

In another embodiment, an ashing method for stripping photoresist and removing post etch residues from a low k dielectric layer comprises selectively ashing the photoresist and/or post etch residues to form methane gas as a principal ashing reaction product. Subsequent rinsing with deionized water may be added to remove any residues from the wafer after ashing is complete.

The present invention is advantageous in that it uses an oxygen free plasma gas composition for generating an oxygen free plasma to strip photoresist and/or post etch residues from low k dielectric surfaces and simultaneously clean any exposed copper surfaces. High etch selectivity in excess of about 10:1 and fast throughput can be obtained for a variety of low k substrates with the inventive process and gas compositions. In addition, the plasma reacts with photoresist and/or residues to produce volatile alkane reaction products that provide a signal that can be easily monitored so that overetching, especially on the low k dielectrics layers, is prevented. Moreover, the use of the gas mixture comprising fluorine and hydrogen bearing gases removes silicon containing post etch residues that are traditionally very difficult to remove. Subsequent rinsing with deionized water may be added to remove any remaining residues from the wafer after the plasma stripping process is completed. The inventive process is economical and easily adaptable to a variety of plasma ashers.

Other embodiments of the invention are contemplated to provide particular features and structural variants of the basic elements. The specific embodiments referred to as well as possible variations and the various features and advantages of the invention will become better understood when considered in connection with the accompanying drawings and the detailed description that follows.

DETAILED DESCRIPTION

Figure 1A:
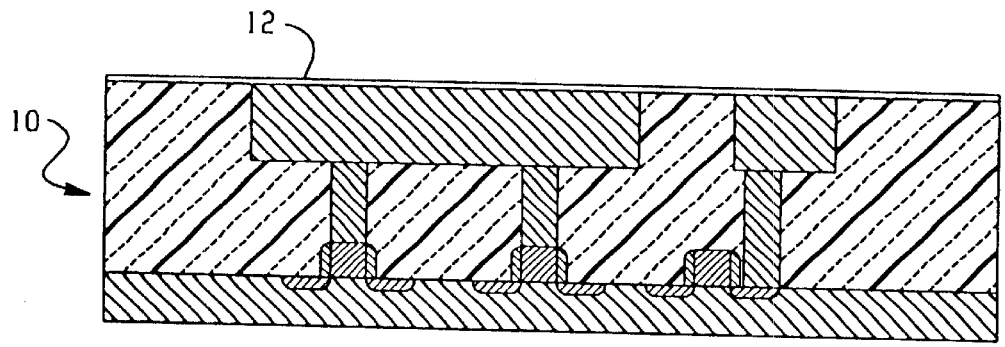
FIG. 1 shows a dual damascene process flow used for manufacture of integrated circuits having copper interconnects and low k dielectric insulating layers.

The present invention is directed to a method of using an oxygen free plasma gas composition for removing photoresist and/or post etch residues from semiconductor wafers by means of a non-oxidative chemical reaction. The oxygen free plasma comprises a hydrogen bearing gas and a fluorine bearing gas. The invention is especially suitable for use with those substrates employing copper interconnects and low k dielectric insulating layers. Low k dielectrics are hereinafter defined as those insulating materials suitable for use in the manufacture of integrated circuits or the like having a dielectric constant less than about 3.5. Low k dielectrics can be generally categorized as one of three types: organic, porous or doped oxides. Examples of organic low k dielectric materials suitable for use in the present invention include polyimides, benzocyclobutene, parylenes, and fluorocarbons. Examples of porous low k dielectric materials include nanoporous oxides and organic polymers such as those sold under the tradenames NANOGLASS and AEROGEL. Examples of doped oxide low k dielectric materials include hydrogen silsesquioxanes, nanoporous oxides, organic polymers, and carbon doped silicon dioxides available under the trade name CORAL and hybrid materials available under the trade name HOSP. Other low k dielectric materials will be apparent to one of ordinary skill in the art in view of this disclosure.

It has been advantageously found that the inventive method of using the oxygen free plasma for removing photoresist and/or post etch residues on a substrate having a low k dielectric layer thereon does not change the dielectric constant of the low k material before and after processing. Moreover, it has been found that the inventive oxygen free plasma process removes or renders water removable silicon containing post etch residues. Still further, the removal of any photoresist and/or post etch residues is done in a period of time that is amenable to high throughput and device yields. Yet, still further, oxygen free plasma processes inhibit the oxidation of any exposed copper, thereby lowering electrical resistance.

The process of manufacturing an integrated circuit or the like usually includes at least one step of coating a photoresist over a semiconductor wafer. Photoresists are generally organic photosensitive films used for transfer of images to an underlying substrate. The present invention is generally applicable to stripping those photoresists used in g-line, i-line, DUV, 193 nm, and 157 nm applications. This includes, but is not limited to novolaks, polyvinylphenols, acrylates, and cyclic olefins. Other suitable photoresist formulations will be apparent to those skilled in the art in view of this disclosure. The photoresist may be positive acting or negative acting depending on the photoresist chemistries and developers chosen.

Referring now to FIG. 1 (A–I), there is depicted a dual damascene process flow commonly used for manufacture of integrated circuits having copper interconnects and low k dielectric layers. The illustrated damascene process is exemplary only. It is understood that a variety of processes can be used to integrate copper and low k dielectrics into the integrated circuit and are generally known by those skilled in the art.

Figure 1B:
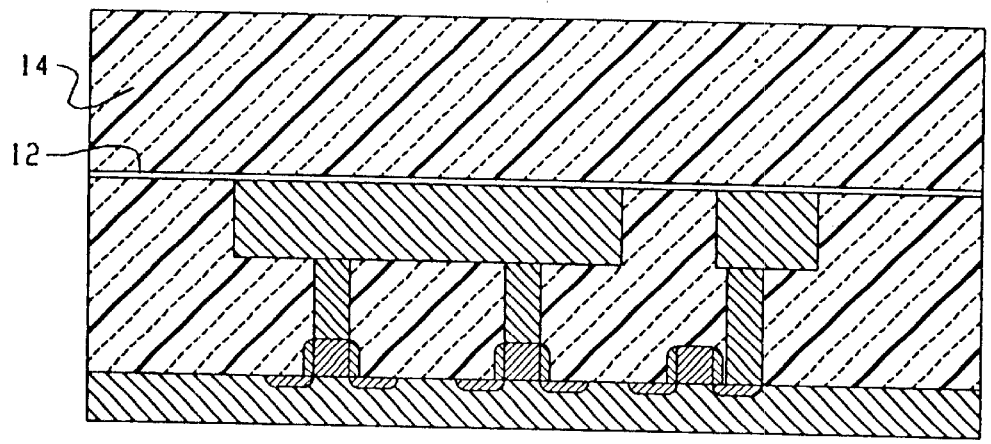
Figure 1C:
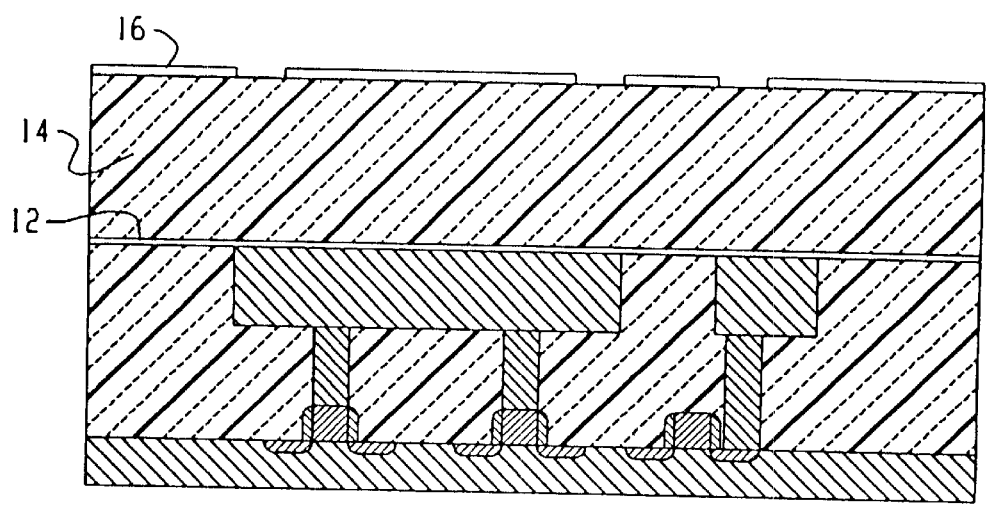
Figure 1D:
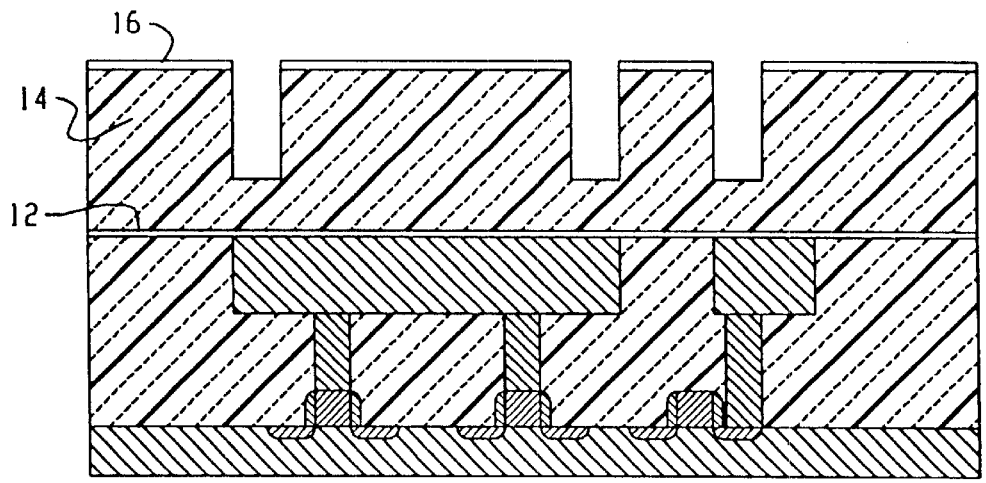
Figure 1E:
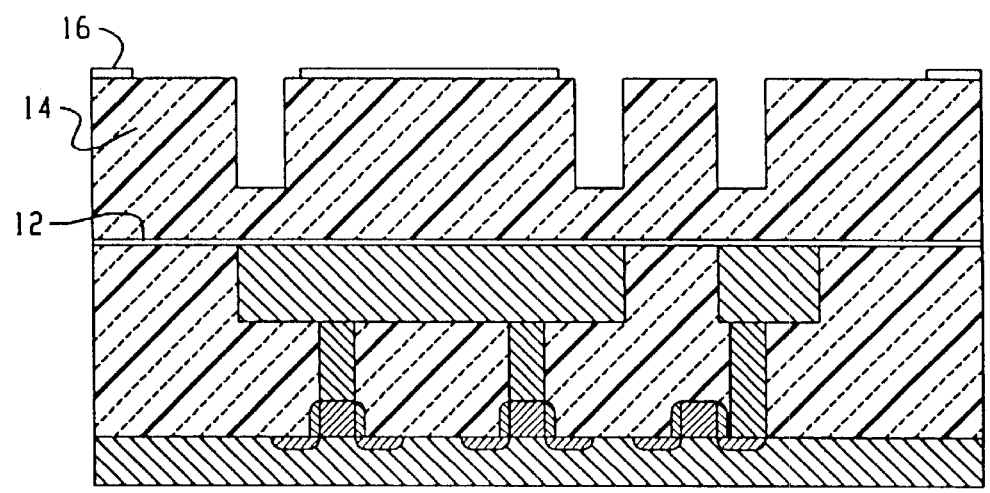
Figure 1F:
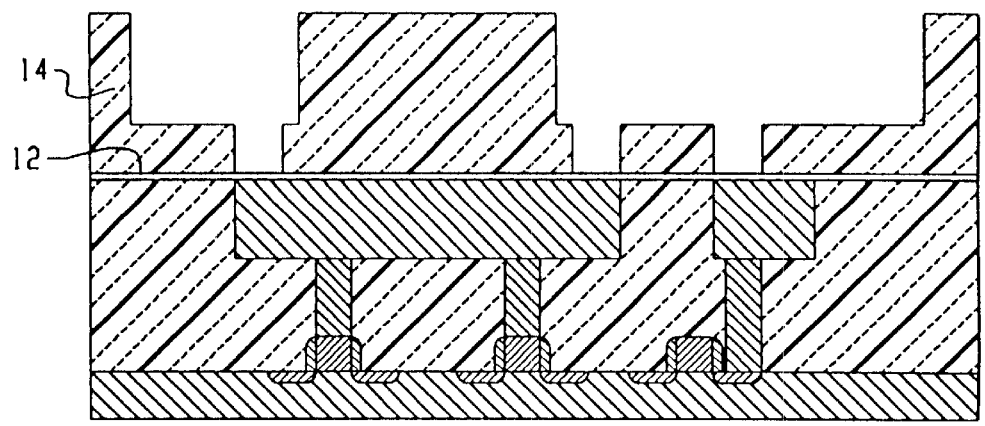
Figure 1G:
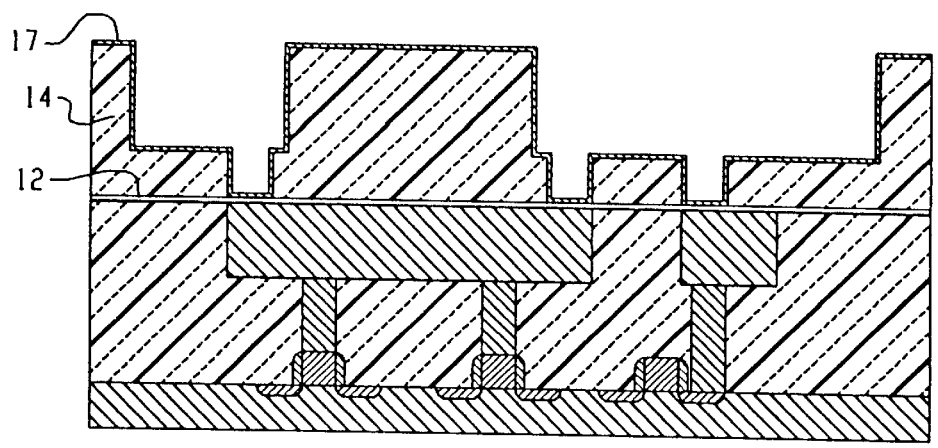
Figure 1H:
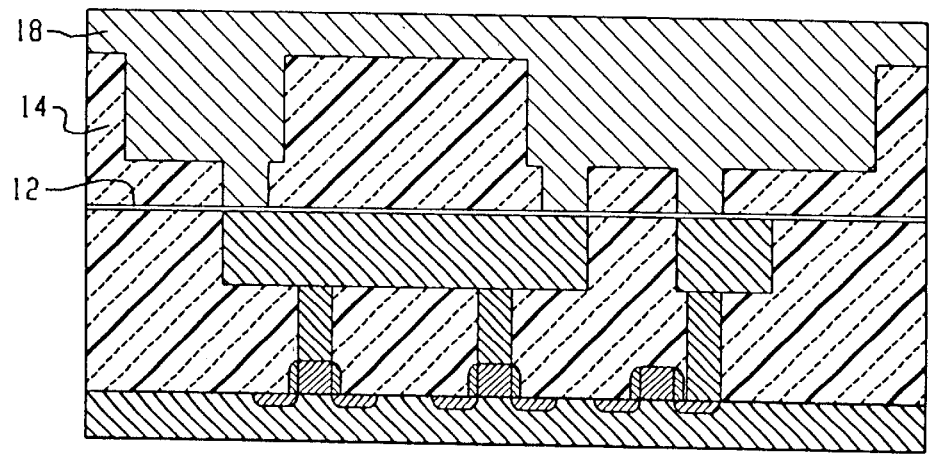
Figure 1I:
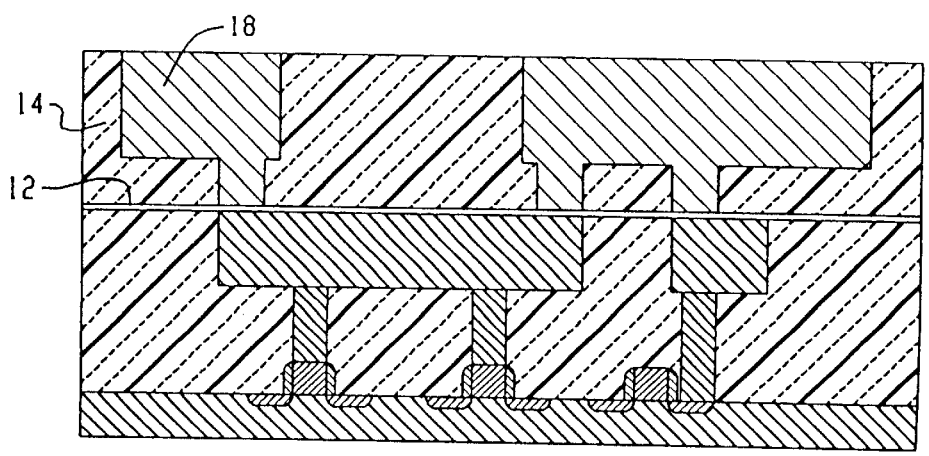

The damascene process is shown occurring on an underlying first metal layer generally designated 10 having a completed metal interconnect and dielectric layer. The first step in the fabrication of each copper interconnect level is deposition of a thin layer of silicon nitride 12 as shown in FIG. 1A. The nitride layer acts a barrier against diffusion of copper between metal levels and also serves as an etch stop in a dielectric etch process. In FIG. 1B, deposition of a thick low k dielectric layer 14 immediately follows deposition of the nitride etch stop layer. The low k material may have a thin layer of oxide on an upper surface. The dielectric layer is patterned by conventional photo-lithographic techniques using a photoresist 16 as a masking material to form the vias as shown in FIG. 1C. The photoresist is coated onto the low k dielectric layer, patterned by exposure to activating energy, and subsequently developed to form a relief image. In FIG. 1D, the relief image is then partially etched into the dielectric layer using conventional etching techniques known to those skilled in the art. The photo-lithographic process is repeated to form a trench layer and subsequently etched as shown in FIGS. 1E and 1F. As shown in FIGS. 1G through 1I, a copper metal deposition process is used to fill the spaces left by the etching and stripping processes to form the second metal layer. Current copper deposition techniques require the deposition of a barrier layer that also acts as a seed layer 17 for subsequent copper deposition as shown in FIG. 1G. After the copper 18 has been deposited the wafer surface is then planarized typically by a chemical and mechanical polishing step. The processes are then repeated and the integrated circuit or the like is formed.

After each etching step, any photoresist and/or post etch residues remaining needs to be removed by stripping so that it does not interfere with any subsequent processing. The inventive stripping process for removing photoresist and/or post etch residues comprises generating an oxygen free plasma from a gas composition comprising a hydrogen bearing gas and a fluorine bearing gas by exposing the gas composition to an energy source capable of forming a plasma of the gas. The oxygen free plasma gas generates reactive species that selectively react with any photoresist and/or post etch residues remaining after the etching step to form a volatile compound. After stripping, the substrate is sometimes rinsed with deionized water to remove any remaining residues. The particular components of the oxygen free plasma gas are selected by their ability to form a gas and a plasma at plasma forming conditions. Preferably, the components are combined and added to the plasma asher as a gas. The oxygen free plasma gas reacts with carbon and other atoms in the photoresist compounds and post etch residues to form volatile compounds at conditions present in a plasma reaction chamber. Moreover, the oxygen free plasma reacts with those traditionally hard to remove post etch residues that contain silicon embedded in the residue.

The fluorine bearing compounds used generate sufficient reactive species to increase the selectivity of the photoresist strip rate to the dielectric etch rates on a substrate having photoresist and a dielectric layer underlying the photoresist layer. Preferred fluorine bearing compounds include those compounds that generate a fluorine reactive species when excited by the plasma. Preferably, the fluorine bearing gas is selected from the group consisting of a compound having the formula $C_xH_yF_z$ wherein x ranges from 1 to 4, y ranges from 0 to 9 and z ranges from 1 to 10, $NF_3$, $F_2$, and $SF_6$. Other fluorine bearing compounds will be apparent to one of ordinary skill in the art in view of this disclosure. More preferably, the fluorine compound is $CF_4$ or $CHF_3$.

The hydrogen bearing compounds include those compounds that contain hydrogen, for example, hydrocarbons, hydrofluorocarbons, hydrogen gas or hydrogen gas mixtures. The hydrogen bearing compounds used are ones that generate sufficient reactive species to increase selectivity of the stripping process. Preferably, the hydrogen bearing compound is a non-flammable hydrogen gas mixture with an inert gas such as nitrogen.

Preferred hydrogen precursor gases are those that exist in a gaseous state and release hydrogen to form reactive hydrogen species such as free radical or hydrogen ions under plasma forming conditions. The gas may be a hydrocarbon that is unsubstituted or may be partially substituted with a halogen such as bromine, chlorine or fluorine, or with oxygen, nitrogen, hydroxyl and amine groups. Preferably, the hydrocarbon has at least one hydrogen and from one to twelve carbon atoms, and more preferably has from three to ten carbon atoms. Examples of suitable hydrogen bearing gases include methane, ethane, ammonia and propane.

Preferred hydrogen gas mixtures are those gases that contain hydrogen gas and an inert gas. Examples of the inert gas include argon, nitrogen, neon, helium or the like. Especially preferred hydrogen gas mixtures are so-called forming gases which consist essentially of hydrogen gas and nitrogen gas. Particularly preferable for use in the present invention is a forming gas wherein the hydrogen gas ranges in an amount from about 3 to about 5 percent by volume of the total forming gas composition due to safety considerations.

The plasma gas composition of the present invention comprises a mixture of the hydrogen bearing compounds and the fluorine bearing compounds. Preferably, the fluorine compounds are less than about 10 percent of the total volume of the composition to maximize etch selectivity. It has been found that when the fluorine bearing compounds are greater than about 10 percent by volume, polymerization of the photoresist byproducts can occur making the photoresist more difficult to remove. Moreover, it was unexpected to find the enhanced removal rates when using a fluorine bearing gas in combination with a hydrogen bearing gas. Typically, the mixing of hydrogen bearing gas with a fluorine bearing gas results in the formation of hydrogen fluoride which is believed to be caused by scavenging of fluorine radicals by hydrogen. Hydrogen fluoride in the plasma is known to those skilled in the art to lower removal efficiency of traditional dielectrics, such as silicon dioxide. Thus, it was unexpected to observe an increase in removal efficiency of residues with low k dielectrics.

Selectivity is defined as the relative removal rate of photoresist and/or post etch residues compared to the underlying layer. It is preferred to have a selectivity of at least 10:1 for low k dielectric substrates wherein the photoresist and/or post etch residues etch 10 times faster than the low k dielectric material. More preferably, the etch selectivity is much greater than 10:1.

Heating the wafer during ashing can increase the reaction rate between the plasma and the photoresist and/or post etch residues. Preferably, for porous and doped oxide low k materials the wafer is heated from about 80° C. to about 350° C. to improve wafer throughput. More preferably, the temperature is step-wise increased during processing. For example, the wafer may first be heated to about 180° C. to remove or render post etch residues water removable, then heated to about 240° C. for subsequent photoresist volatilization. Preferably, for organic low k materials the wafer is heated from about 80° C. to a maximum of about 180° C. The maximum temperature for organic dielectrics is dependent on the intrinsic properties of the organic low k material used and is easily determined by thermal analysis techniques known to those skilled in the art. Still further, it has been found that certain post etch residues are more easily removed at the lower temperatures. It is believed that certain post etch residues undergo a chemical change at the higher temperatures that makes these residues more resistant to stripping.

The removal rate can also be further optimized as is known to those skilled in the art. For example, the plasma chamber pressure can be changed from about 0.5 torr to about 10 torr, the power can be adjusted from about 500 W to about 2000 W and the total gas flow rates can be adjusted from about 500 sccm to about 9000 sccm.

Plasma asher devices particularly suitable for use in the present invention are downstream plasma ashers, such as for example, those microwave plasma ashers available under the trade name GEMINI ES and commercially available from Eaton Corporation. Portions of the microwave plasma asher are described in U.S. Pat. Nos. 5,498,308 and 4,341,592, and PCT International Application No. WO/97/37055, herein incorporated by reference in their entireties. The invention is not limited to any particular plasma asher in this or in the following embodiments. For instance, an inductively coupled plasma reactor can be used.

Figure 2:
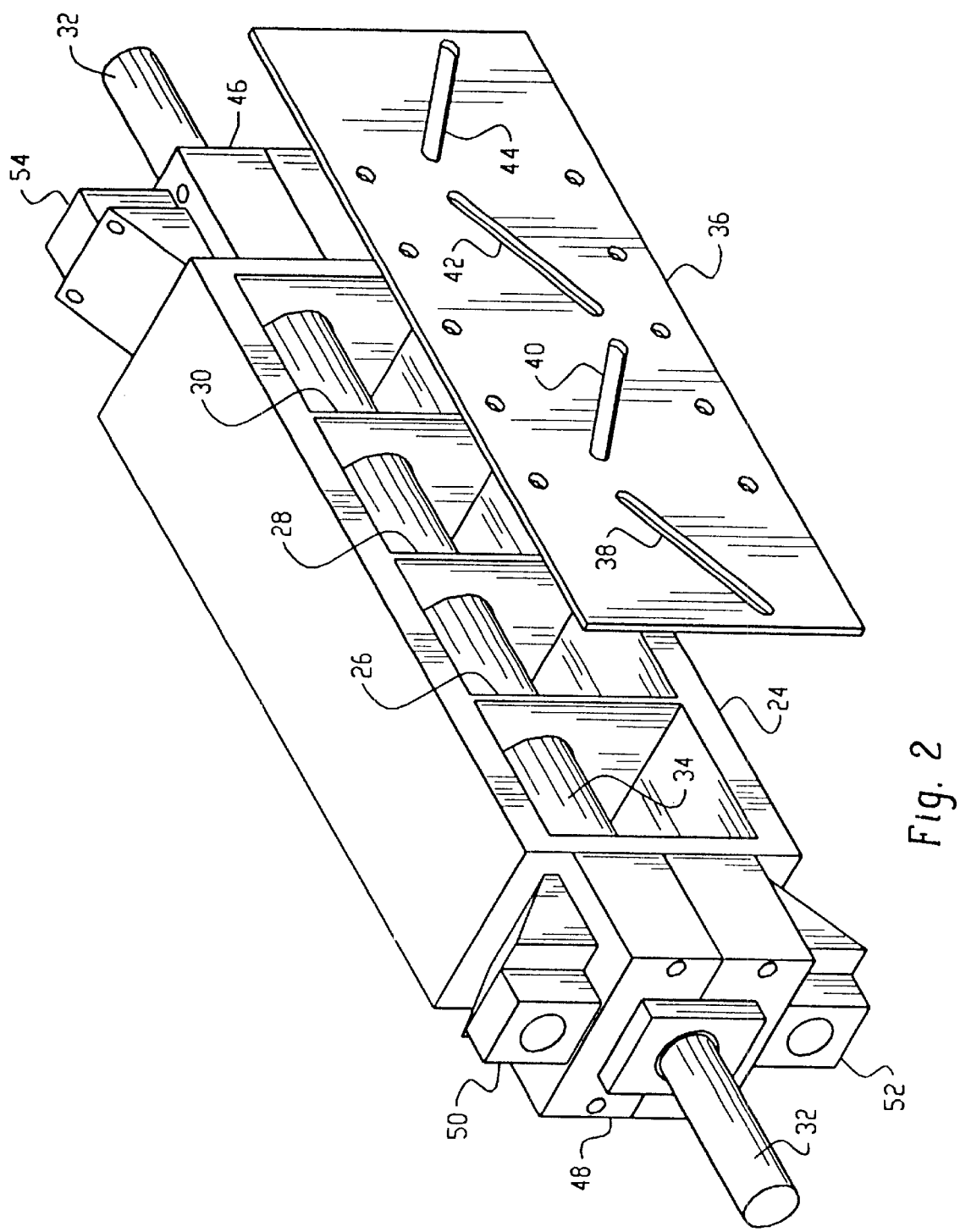
FIG. 2 shows a perspective view of a microwave enclosure for use in a plasma asher.
Figure 3:
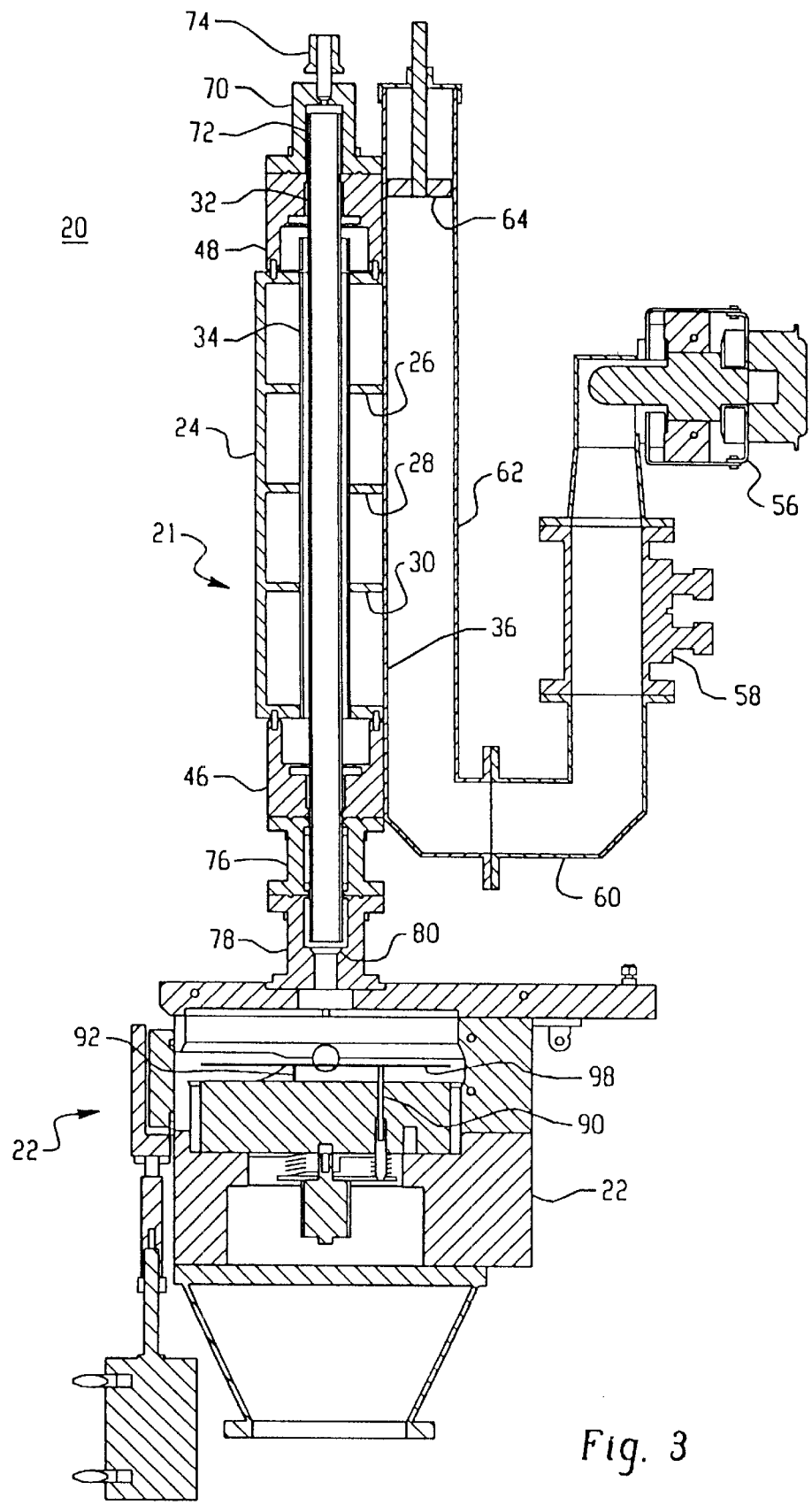
FIG. 3 shows a cross sectional view which schematically shows a plasma asher in which the invention can be practiced.

Referring now to FIGS. 2 and 3 in particular, there is depicted a microwave plasma asher which is generally designated by reference numeral 20 and is suitable for practicing the method of photoresist and/or post etch residue removal by treatment with oxygen free plasma. The illustrated plasma asher includes a plasma generating chamber 21 and a plasma reaction chamber 22. The plasma generating chamber includes a microwave enclosure 24. The microwave enclosure is a rectangular box which is partitioned into lengthwise sections 26, 28, and 30 having plasma tube 32 passing therethrough. Each partition has an opening through which the plasma tube passes. Each section is fed with microwave energy. Thus, each section appears to be a relatively short cavity to the incoming microwave energy, promoting the formation of modes having azithumal and axial uniformity. Outer tube 34 surrounds the plasma tube inside the cavity. The outer tube is slightly separated from the plasma tube and air under positive pressure is fed between the two tubes to provide effective cooling of the plasma tube. Tube 34 is preferably made of sapphire. Other plasma tube materials such as quartz or alumina coated quartz can be used.

The openings in the partitions 26, 28, and 30 through which the concentric tubes are fed are made larger than the exterior dimension of the plasma tube. There is microwave transmission through such openings which causes a plasma to be excited in the part of the tube that is surrounded by the partition. Such transmission helps reduce thermal gradients in the plasma tube between regions surrounded by partitions and regions that are not. If an outer tube is not used (cooling provided in some other manner) the openings in the partition are sized so that there is a space between the plasma tube and the partition to provide such microwave transmission. FIG. 2 shows the space between the outer tube and the partition.

Also shown is an iris plate 36 which covers the open side of the microwave structure and is effective to feed microwave energy into adjacent sections. Plate 36 is a flat metallic pate having irises 38, 40, 42, 44, through which the microwave energy is fed.

Microwave traps 46 and 48 are provided at the ends to prevent microwave transmission. Such traps may be of the type disclosed in U.S. Pat. No. 5,498,308, which is incorporated herein by reference. Air seals/directional feeders 50 and 52 are provided for admitting cooling air and feeding it to the space between the concentric tubes. Air seals/directional feeder 54 is shown at the outlet end and a fourth such unit is present but is not seen.

Magnetron 56 provides microwave power which is fed through coupler 58 to a waveguide supplying $TE_{10}$ mode, having mutually perpendicular sections 60 and 62. The length of waveguide section 62 is adjustable with moveable plunger 64. The bottom plate of waveguide section 62 is iris plate 66, which couples microwave energy into partitioned microwave structure 24, through which the plasma tube 32 extends; thus a plasma is excited in the gas flowing through the plasma tube.

Referring again to FIG. 3, it is seen that end cap 70 abuts microwave trap 48, and fitting 74 having a central orifice for admitting gas to the plasma tube extends into the end cap. The gas supply is regulated by an external flow box (not shown).

The plasma tube is supported at this end by "o" ring 72 in the end cap. The outer tube 34 is supported at its ends by abutment against microwave traps 46 and 48. Spacer 76 is present to provide the proper spacing in relation to the process chamber. The other end of the plasma tube is located in end member 78, and has an orifice 80 for emitting gas into the process chamber.

The plasma reaction chamber 22 includes wafer support pins 90 and 92, which support wafer 98, to be processed. A chuck (not shown) may alternatively be used. Heating may be accomplished by an array of tungsten halogen lamps (not shown) positioned below the wafer. Preferably, the substrate is heated from about 80° C. to about 350° C. during ashing. More preferably, the substrate is stepwise heated by incrementally increasing the temperature. Heating has been found to increase the reaction rate of the plasma with the photoresist and/or post etch residues and consequently, increase throughput. One or more baffle plates may be present above the wafer to promote even distribution of the plasma to the surface. Additionally, the reaction chamber may include a monochromator (not shown) The monochromator optically detects an emission peak having a particular wavelength range that corresponds to the reaction product between the plasma and the photoresist.

Figure 4:
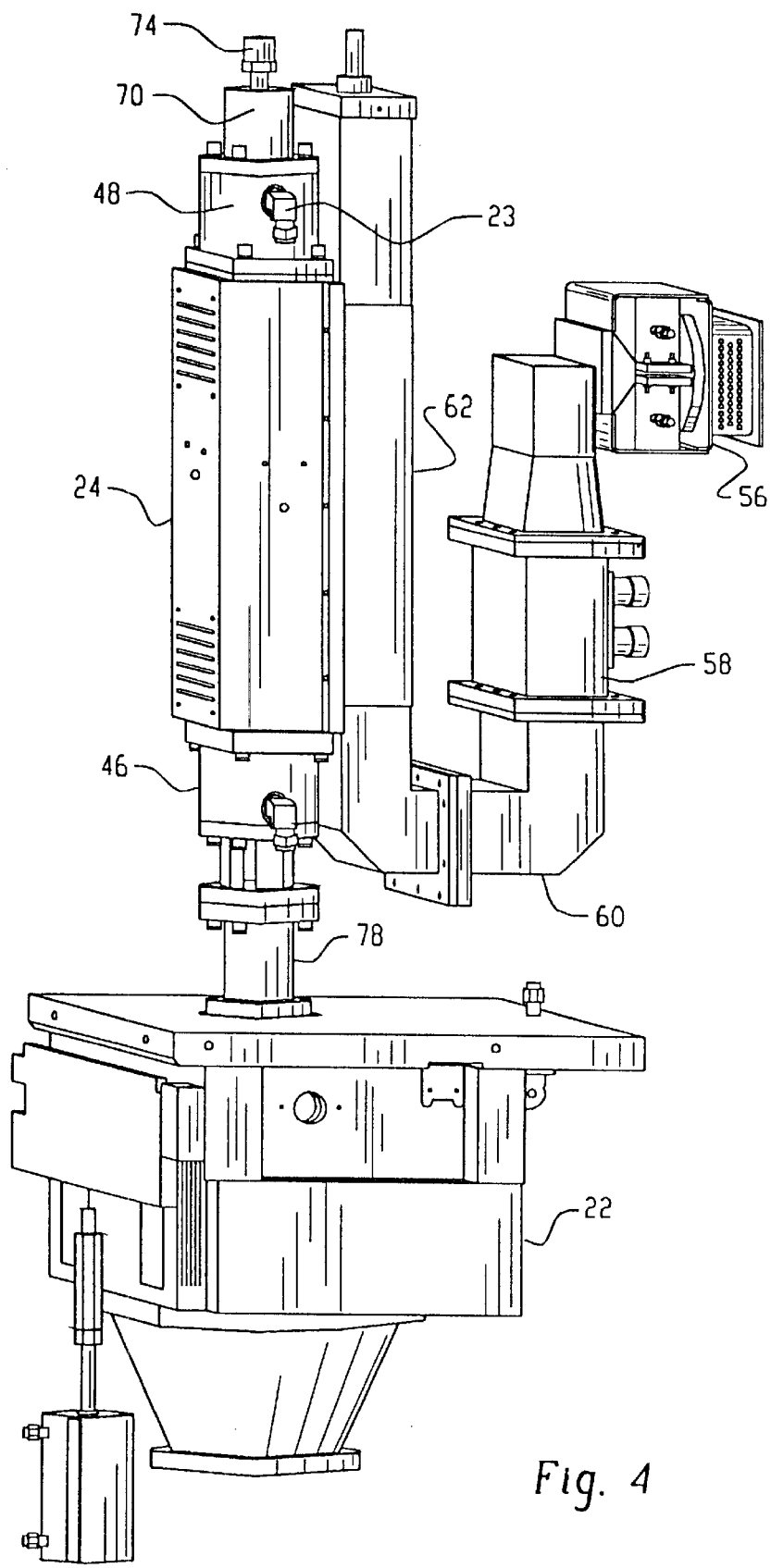
FIG. 4 shows a perspective view of the plasma asher depicted in FIG. 3.

Referring to FIG. 4, an exterior view of the device is shown. The reference numerals in FIG. 4 correspond to those which are used in the other Figures.

Preferably, the microwave enclosure 24 is dimensioned to support the rectangular $TM_{110}$ mode and the enclosure 24 may have a square cross section. The dimensions of the cross sections are such that the $TM_{110}$ mode is resonant. The length of each section is less than $\lambda_g/2$ where $\lambda_g$ is the guide length within the cavity of the $TE_{104}$ mode.

Figure 5:
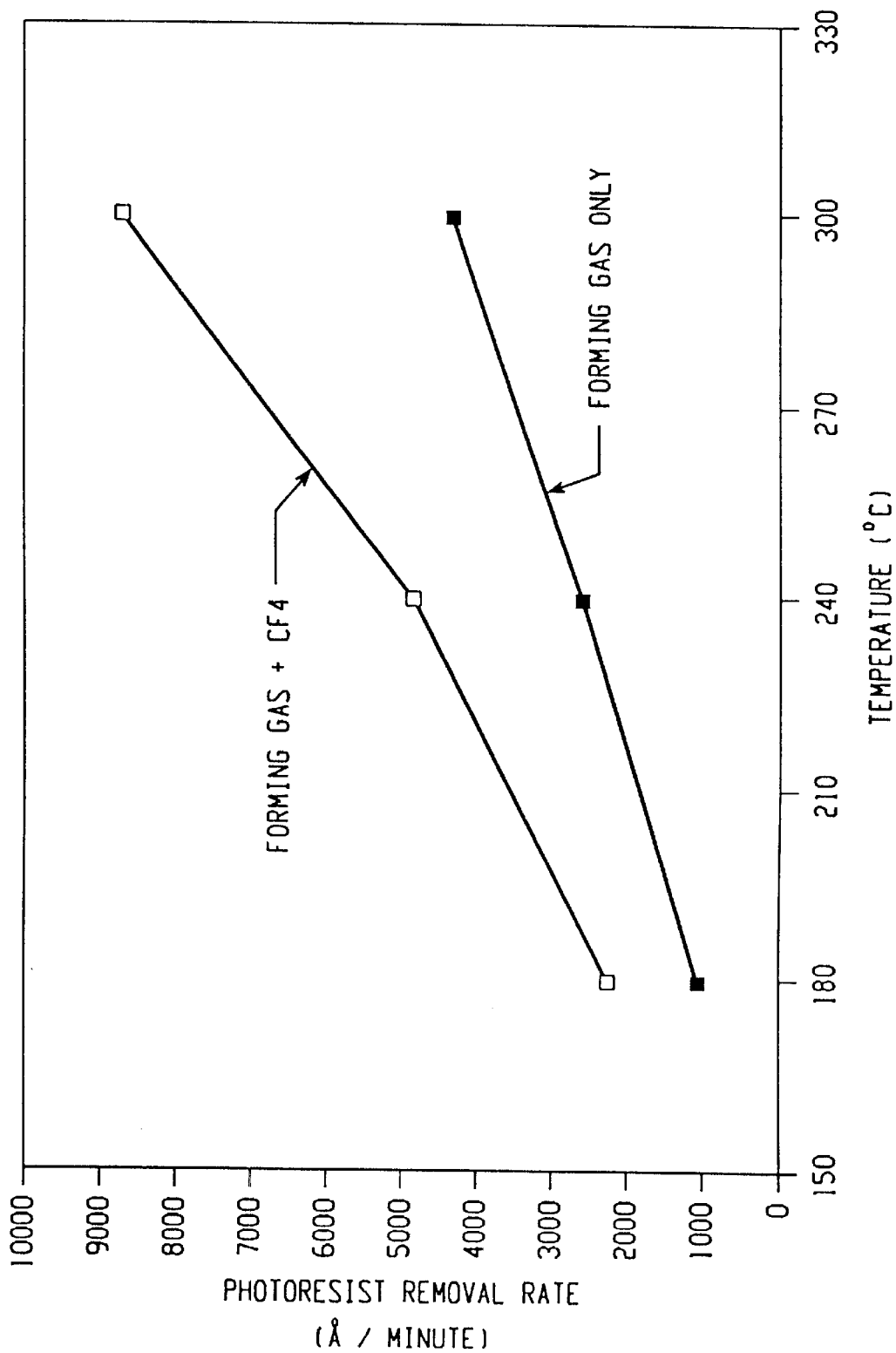
FIG. 5 is a graph showing the rate of photoresist removal versus wafer temperature for various plasma gas compositions.

In operation, the semiconductor wafer 98 with photoresist and/or post etch residues thereon is placed into the reaction chamber 22 on wafer support pins 90 and 92. The wafer is preferably heated to accelerate the reaction of the photoresist and/or post etch residues with the plasma. The pressure within the reaction chamber is reduced. Preferably the pressure is maintained between about 1 torr to about 5 torr. An excitable gas mixture of the hydrogen bearing gas and the fluorine bearing gas is fed into plasma tube 32 of the plasma generating chamber 21 via a gas inlet 23 (as shown in FIG. 5). The fluorine bearing gas is preferably less than 10 percent of the total gas composition. Each section 26, 28, 30 is fed with microwave energy to excite a plasma in the plasma tube, which plasma is comprised of electrically neutral and charged particles. The charged particles are selectively removed prior to the plasma entering the reaction chamber. It is believed that the excited or energetic atoms of fluorine (atomic fluorine) and hydrogen (atomic hydrogen) are fed into the reaction chamber and react with the photoresist and/or post etch residue. A principal reaction product, methane gas, evolves and is monitored optically by the monochromator. The methane gas is continuously swept away by a gas sweep within the reaction chamber. The monochromator detects the emission peak of methane. Once the emission peak reaches a minimum the removal of photoresist and/or post etch residues is complete and the plasma is turned off. Alternatively, the plasma may be run for a predetermined time. This has been found to be particularly useful for removing post etch residues from the substrate wherein the photoresist remaining after etch is minimal. It has been found that the emission peak is not be easily detected if a sufficient quantity of photoresist is not present. It is believed that a detectable emission peak is primarily derived from the reaction between the plasma and the photoresist. A deionized water rinse is then used to remove any remaining residue on the stripped wafer. The vacuum is then released and the processed wafers are removed from the reaction chamber.

EXAMPLE 1

In the following example, a DUV photoresist was coated onto multiple hexamethyldimethylsilane treated silicon wafers at 3000 rpm. The photoresist is available under the trade name UV5-1.0 and commercially available from Shipley Company. After softbaking each wafer for 45 seconds at 130° C. on a vacuum hotplate a tack free photoresist film was obtained having a thickness of about 10,000 angstroms. The photoresist film was then exposed to microwave plasma using a Fusion Gemini ES Plasma Asher available from Eaton Corporation. The plasma chamber power was set at 1800 W with a chamber pressure of 1.5 torr. The wafers were divided into two sets of three wafers. One set of wafers were individually exposed to a plasma generated from forming gas with a gas flow rate of 3500 sccm. The other set of wafers were individually exposed to a plasma generated from a mixture of forming gas and $CF_4$. The gas flow rate for the forming gas was 3400 sccm and the $CF_4$ gas was 100 sccm. The forming gas used was a mixture of hydrogen and nitrogen gases wherein the hydrogen gas was 5% by volume of the total forming gas mixture. The wafer temperature was varied from 180° C. to 300° C. Plasma ashing rates were determined by measuring film thickness of the photoresist before and after ashing.

FIG. 5 shows a graph depicting the photoresist removal rate versus substrate temperature for two different gas plasmas. The results indicate that the mixture of forming gas with $CF_4$ gave the fastest ashing rates compared to the use for forming gas only. Increasing wafer temperature increased the ashing rate of the photoresist by the plasma. The data demonstrates that high throughput is obtainable with the oxygen free plasma process for stripping photoresist from silicon wafers.

EXAMPLE 2

As illustrated by this example, a significant advantage of the preferred oxygen free plasma process according to the invention is the high selectivity on low k dielectric materials. Carbon doped silicon dioxide wafers available from Novellus Corporation under the trade name CORAL were coated with photoresist as in Example 1. The power setting of the GEMINI ES plasma asher was 1800 W with a chamber pressure of 3.0 torr. Forming gas was flowed at a rate of 3500 sccm. The forming gas used was a mixture of hydrogen and nitrogen gases wherein the hydrogen gas was 5% by volume of the total forming gas mixture. The coated wafers were heated to 300° C. and exposed to the plasma. The photoresist removal rate was determined to be about 4000 angstroms per minute. Uncoated wafers were exposed under the same conditions and the low k dielectric material was found to be removed at about 143 angstroms per minute. Selectivity is determined from a ratio of the removal rates for each substrate. Thus, the ashing selectivity is 4000/143 or greater than 25:1. Consequently, in this example, the photoresist will be removed 25 times faster than the dielectric material.

EXAMPLE 3

In the following example, carbon doped silicon dioxide wafers available from Novellus Corporation under the trade name CORAL were coated with photoresist as in Example 1 and exposed to a different plasma generated under the same conditions as in Example 2. The plasma was generated from a mixture of forming gas and $CF_4$. The gas flow rate for the forming gas was 3400 sccm and the $CF_4$ gas was 100 sccm. The forming gas used was a mixture of hydrogen and nitrogen gases wherein the hydrogen gas was 5% by volume of the total forming gas mixture. The ashing rate of the photoresist was determined to be about 8700 angstroms per minute. The ashing rate of CORAL was determined to be about 449 angstroms per minute. Thus, the ashing selectivity of the photoresist to CORAL was about 20:1. The higher ashing rate observed with the mixture of forming gas with $CF_4$ indicates that a higher reactivity is obtained by including a fluorine bearing gas in the gas mixture. The higher reactivity of the plasma with the photoresist translates into improved throughput.

Moreover, it was unexpected to obtain the enhanced removal rates when using the fluorine bearing gas in combination with the hydrogen bearing gas. Typically, the mixing of a hydrogen bearing gas with a fluorine bearing gas results in the formation of hydrogen fluoride which is believed to be caused by scavenging of fluorine radicals by hydrogen. Hydrogen fluoride in the plasma is known to those skilled in the art to lower removal efficiency of traditional dielectrics, such as silicon dioxide. Thus, it was unexpected to observe an increase in removal efficiency of photoresist and/or residues in the presence of low k dielectrics.

The foregoing description of the preferred embodiments of the invention have been presented for purposes of illustration and description. It is not intended to be exhaustive or to limit the invention to the precise forms disclosed. Obvious modifications or variations are possible in light of the above teachings. The embodiments were chosen and described to provide the best illustration of the principles of the invention and its practical applications to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A post etch process for removing post etch residues from a semiconductor wafer, the post etch process comprising:

exposing a surface of the semiconductor wafer containing post etch residues thereon to an oxygen free plasma wherein a gas for generating the plasma comprises a hydrogen bearing gas and a fluorine bearing gas; and selectively removing the post etch residues from the surface of the semiconductor wafer at a removal rate greater than a rate of removal of a material that makes up the surface of the semiconductor wafer to leave the surface of the semiconductor wafer substantially the same as before the step of exposing the surface to the oxygen free plasma.

2. The post etch process of claim 1 wherein the surface comprises an organic low k dielectric material, wherein a dielectric constant of the material is less than about 3.5.

3. A method for removing photoresist and/or post etch residues from a substrate comprising:

a. placing at least one substrate having photoresist and/or post etch residues thereon into a wafer processing chamber;

b. forming a reactive species by generating a plasma in the absence of oxygen wherein a gas for generating said plasma comprises a hydrogen bearing gas and a fluorine bearing gas; and c. selectively removing the photoresist and/or the etch residues including sidewall polymer depositions from an underlying layer in contact with the photoresist and/or post etch residues by exposing the substrate to said reactive species;

d. said selectivity of etching by said plasma between the photoresist and/or post etch residues to the underlying layer is greater than about 10 to 1.

4. An ashing method for stripping photoresist and/or post etch residues from a semiconductor wafer, the method comprising:

a. forming a reactive species by generating an oxygen free plasma, wherein said plasma is generated from a gas mixture comprising hydrogen gas;

b. exposing a wafer having a pattern of photoresist and/or post etch residues thereon to said plasma, wherein said wafer comprises a top layer of patterned photoresist and an underlying insulating layer;

c. selectively removing the photoresist and/or post etch residues from the insulating layer including sidewall polymer depositions at a removal rate about 10 times greater than a rate of removal of the insulating layer by exposing the substrate to said reactive species; and d. turning off said plasma after the photoresist and/or post etch residues have been removed.

5. The method of claim 4 wherein said insulating layer comprises a material having a dielectric constant of the material less than about 3.5.

6. The method of claim 4 wherein said plasma generates hydrogen reactive species.

* * * * *